(12) United States Patent
Kimura et al.

(10) Patent No.: US 7,463,475 B2
(45) Date of Patent: Dec. 9, 2008

(54) MULTILAYER ELECTRONIC COMPONENT, ELECTRONIC DEVICE, AND METHOD FOR MANUFACTURING MULTILAYER ELECTRONIC COMPONENT

(75) Inventors: Masahiro Kimura, Ogaki (JP); Yoshifumi Saito, Otsu (JP)

(73) Assignee: Murata Manufacturing Co., Ltd., Nagaokakyo-shi (JP)

( * ) Notice: Subject to any disclaimer, the term of this patent is extended or adjusted under 35 U.S.C. 154(b) by 101 days.

(21) Appl. No.: 11/741,857

(22) Filed: Apr. 30, 2007

(65) Prior Publication Data

US 2007/0267218 A1 Nov. 22, 2007

Related U.S. Application Data

(63) Continuation of application No. PCT/JP2006/312300, filed on Jun. 20, 2006.

(30) Foreign Application Priority Data

Jul. 27, 2005 (JP) .............................. 2005-217376

(51) Int. Cl.
*H01G 4/228* (2006.01)
(52) U.S. Cl. .............. 361/306.1; 361/306.3; 361/321.1; 361/321.2; 361/311; 361/313
(58) Field of Classification Search ............. 361/306.1, 361/306.2, 306.3, 311–313, 302–305, 321.1, 361/321.2
See application file for complete search history.

(56) References Cited

U.S. PATENT DOCUMENTS

| | | | | |
|---|---|---|---|---|
| 6,061,227 A | * | 5/2000 | Nogi | 361/303 |
| 6,462,931 B1 | * | 10/2002 | Tang et al. | 361/305 |
| 6,528,145 B1 | * | 3/2003 | Berger et al. | 428/156 |
| 6,577,490 B2 | * | 6/2003 | Ogawa et al. | 361/306.1 |
| 6,606,237 B1 | * | 8/2003 | Naito et al. | 361/306.3 |
| 6,711,029 B2 | * | 3/2004 | Fisher et al. | 361/792 |

(Continued)

FOREIGN PATENT DOCUMENTS

JP 60-094794 5/1985

(Continued)

OTHER PUBLICATIONS

PCT/JP2006/312300, International Search Report dated Aug. 22, 2006.

(Continued)

*Primary Examiner*—Nguyen T Ha
(74) *Attorney, Agent, or Firm*—Dickstein, Shapiro, LLP.

(57) ABSTRACT

A multilayer electronic component having a ceramic substrate and a resin layer mounted on a mounting substrate. Recess portions are formed at an outside-facing major surface side of the resin layer. In the resin layer, columnar conductors are disposed so that axis line directions thereof are aligned in a thickness direction of the resin layer. End portions of the columnar conductors are located inside the recess portions further from opening faces thereof and have end surfaces exposed in the recess portions. When a multilayer electronic component is mounted on a mounting substrate, solder is provided on the end surfaces of the columnar conductors in the recess portions. The thickness of solder used in the above mounting does not interfere with a reduction in size and height of an electronic device that includes the above multilayer electronic component.

20 Claims, 5 Drawing Sheets

U.S. PATENT DOCUMENTS 6,795,294 B2 * 9/2004 Kuroda et al. ............ 361/306.1
7,095,602 B1 * 8/2006 Kimura ................... 361/306.3

FOREIGN PATENT DOCUMENTS

| JP | 06-120672 | 4/1994 |
| --- | --- | --- |
| JP | 7-202372 | 8/1995 |
| JP | 7-231050 | 8/1995 |
| JP | 09-083141 | 3/1997 |
| JP | 10-340929 | 12/1998 |
| JP | 2002-261120 | 9/2002 |
| JP | 2003-008216 | 1/2003 |
| JP | 2003-124435 | 4/2003 |

OTHER PUBLICATIONS

PCT/JP2006/312300, Written Opinion dated Aug. 22, 2006.

* cited by examiner

MULTILAYER ELECTRONIC COMPONENT, ELECTRONIC DEVICE, AND METHOD FOR MANUFACTURING MULTILAYER ELECTRONIC COMPONENT

CROSS REFERENCE TO RELATED APPLICATIONS

The present application is a continuation of International Application No. PCT/JP2006/312300, filed Jun. 20, 2006, which claims priority to Japanese Patent Application No. JP2005-217376, filed Jul. 27, 2005, the entire contents of each of these applications being incorporated herein by reference in their entirety.

FIELD OF THE INVENTION

The present invention relates to a multilayer electronic component, an electronic device comprising the multilayer electronic component, and a method for manufacturing a multilayer electronic component, and in particular, relates to a multilayer electronic component having a laminate structure in which a resin layer is formed on a ceramic substrate, an electronic device having the structure in which this multilayer electronic component is mounted on a mounting substrate, and a method for manufacturing a multilayer electronic component.

BACKGROUND OF THE INVENTION

As a multilayer electronic component which is of interest to the present invention, for example, there is known an electronic component which is integrally formed from a plurality of electronic elements, such as a semiconductor element and a chip element, and which has the structure in which these electronic elements are mounted on a major surface of a ceramic substrate, and in which the electronic elements are buried in a resin layer formed on the major surface of the ceramic substrate (for example, see Patent Document 1).

When a particular electronic device is formed using a multilayer electronic component having the structure as described above, the multilayer electronic component is mounted on a mounting substrate which is to be used as a mother board. The multilayer electronic component has pad electrodes for external connection, which are generally formed on an outside-facing major surface of a resin layer of the multilayer electronic component, and when the pad electrodes are connected to conductive lands formed on the mounting substrate by soldering, a mounting state is obtained. The above pad electrodes are electrically connected to respective wiring conductors provided at a ceramic substrate side via conductors (i.e., columnar conductors) disposed in the resin layer.

In addition, reduction in size and height has been always required of an electronic device having the multilayer electronic component as described above. As described above, when the structure in which the multilayer electronic component is mounted on the mounting substrate is carefully observed, even the thickness of a solder provided between the pad electrode at the multilayer electronic component side and the conductive land at the mounting substrate side interferes with the reduction in size and height, and when the reduction in size and height is further pursued, the reduction in thickness of the solder also becomes an important subject. Furthermore, it may also be construed that even the thickness of the pad electrode and that of the conductive land also interfere with the reduction in size and height.

Patent Document 1: Japanese Unexamined Patent Application Publication No. 2003-124435

SUMMARY OF THE INVENTION

Accordingly, an object of the present invention is to provide a multilayer electronic component which can sufficiently meet the requirement for reduction in size and height described above and a method for manufacturing the multilayer electronic component.

Another object of the present invention is to provide an electronic device configured to realize the reduction in size and height, which has the structure in which a multilayer electronic component is mounted on a mounting substrate.

The present invention relates to a multilayer electronic component having a ceramic substrate and a resin layer formed on a major surface of the ceramic substrate, and the multilayer electronic component has the following structure in order to solve the technical problems described above.

That is, at least one recess portion is disposed in the resin layer at an outside-facing major surface thereof. In addition, in the resin layer, at least one columnar conductor is disposed so that an axis line direction thereof is aligned in a thickness direction of the resin layer. A first end portion of this columnar conductor in the axis line direction reaches at least an interface between the ceramic substrate and the resin layer, and a second end portion of the columnar conductor opposite to the first end portion is located inside the recess portion further from an opening face thereof and has an end portion which is exposed in the recess portion.

The columnar conductor is preferably formed from a sintered metal conductor integrated with a via conductor formed in the ceramic substrate.

An end surface of the columnar conductor may be partly exposed in the recess portion, the second end portion of the columnar conductor may protrude from a bottom surface of the recess portion, or the second end portion of the columnar conductor may have a cross-sectional area larger than a cross-sectional area of the first end portion.

The multilayer electronic component according to the present invention may further comprise a first electronic element which is mounted on the ceramic substrate and which is built in the resin layer. In the case described above, the dimension in a height direction of the first electronic element on the ceramic substrate may be greater than the dimension in the axis line direction of the columnar conductor on the ceramic substrate.

The multilayer electronic component according to the present invention may further comprise a second electronic element which is received inside the recess portion described above. The second electronic element is located inside the recess portion further from the opening face thereof.

The present invention relates to an electronic device comprising the multilayer electronic component as described above and a mounting substrate on which this multilayer electronic component is mounted. In the electronic device according to the present invention, the multilayer electronic component is disposed so that the major surface in which the recess portion is formed faces the mounting substrate, and the columnar conductor is electrically connected to a conductive connection portion formed on the mounting substrate via a conductive connection member provided inside the recess portion.

In the electronic device according to the present invention, the conductive connection member preferably comprises a solder.

In addition, the conductive connection portion protrudes from a surface of the mounting substrate by a predetermined height, and the conductive connection portion is preferably fitted inside the recess portion.

The present invention also relates to a method for manufacturing a multilayer electronic component.

The method for manufacturing a multilayer electronic component according to the present invention comprises: a composite-substrate-forming process for forming a composite substrate including a ceramic substrate, and a resin layer formed on a major surface of the ceramic substrate, wherein at least one columnar conductor embedded in the resin layer so that an axis line direction of the columnar conductor is aligned in a thickness direction of the resin layer; and a recess-portion-forming process for forming at least one recess portion at an outside-facing major surface of the resin layer so as to expose at least an end surface of an end portion of the columnar conductor, the end portion being located at the outside-facing major surface of the resin layer.

The composite-substrate-forming process described above is preferably performed as described below.

A not-yet sintered composite laminate is first formed which includes a not-yet sintered ceramic molded body having a conductive portion formed at a predetermined position of a major surface of the not-yet sintered ceramic molded body and a non-sinterable inorganic material molded body which contains an inorganic material powder, which is not sintered at a sintering temperature of the ceramic molded body, and in which the columnar conductor is embedded so that the axis line direction thereof is aligned in a thickness direction of the non-sinterable inorganic material molded body, wherein the not-yet sintered ceramic molded body and the non-sinterable inorganic material molded body are laminated such that the conductive portion and an end portion of the columnar conductor is brought into contact with each other.

Next, the not-yet sintered composite laminate is fired at a temperature at which the ceramic molded body is sintered and at which the inorganic material molded body is not sintered. Accordingly, the ceramic molded body is formed into the ceramic substrate.

Next, the non-sinterable inorganic material molded body is removed from the fired composite laminate. As a result, the ceramic substrate provided with the columnar conductor protruding from a major surface of the ceramic substrate is obtained.

Next, the resin layer is formed on the major surface of the ceramic substrate so as to bury the columnar conductor, and as a result, the above-described composite substrate is formed.

In the preferable embodiment described above, the conductive portion provided at a predetermined position of the major surface of the not-yet sintered ceramic molded body is preferably formed from a via conductor formed in the ceramic substrate.

In addition, in the preferable embodiment described above, in order to form the resin layer, the resin layer is preferably formed by transfer molding.

In addition, before the step of forming the resin layer, a step of mounting an electronic element on the major surface of the ceramic substrate may be performed.

In addition, in the method for manufacturing a multilayer electronic component, according to the present invention, the recess-portion-forming process may be performed by irradiating the outside-facing major surface of the resin layer with laser light.

In addition, the resin layer may be made of a photosensitive resin. In this case, the recess-portion-forming process includes a step of exposing the photosensitive resin with a mask having an opening at an area other than an area at which the recess portion is to be formed and a step of performing development to form the recess portion.

According to the multilayer electronic component of the present invention, since the end surface of the columnar conductor disposed inside the resin layer is located inside the recess portion further from the opening face thereof and is also exposed in the recess portion, when this multilayer electronic component is mounted on the mounting substrate, the conductive connection member, such as a solder, configured to electrically connect the columnar conductor to the conductive connection portion formed on the mounting substrate can be disposed inside the recess portion.

Accordingly, regardless of the thickness of the conductive connection member, the reduction in size and height of the electronic device having the structure in which the multilayer electronic component is mounted on the mounting substrate can be realized. In addition, since the thickness of the conductive connection member can be increased without interfering with the reduction in size and height, the reliability of the electrical connection between the columnar conductor and the mounting substrate can be improved.

In the multilayer electronic component according to the present invention, when the columnar conductor is formed from the sintered metal conductor integrated with the via conductor formed in the ceramic substrate, the reliability in electrical connection at the interface between the ceramic substrate and the resin layer can be improved, and in addition, the mechanical strength can also be increased. In addition, the columnar conductor can be made to have superior conductivity, heat dissipation properties, and solder bonding properties. In addition, in the structure described above, when the aspect ratio of the columnar conductor is high, a stress is concentrated on the columnar conductor at an interface portion between the ceramic substrate and the resin layer, and cracking is liable to occur; however, when the recess portion is provided in the resin layer, the aspect ratio can be decreased.

When the end surface of the columnar conductor is partly exposed in the recess portion, while the mechanical strength of the columnar conductor is increased by increasing the cross-sectional area of the columnar conductor, the area of a bonding portion of the conductive connection member, such as a solder, which is used when the multilayer electronic component is mounted on the mounting substrate, can be decreased. As a result, the degree of freedom of surface wiring and the like of the mounting substrate can be increased.

When the second end portion of the columnar conductor is exposed at the bottom surface of the recess portion, the conductive connection member provided when the multilayer electronic component is mounted on the mounting substrate adheres onto the side surface of the columnar conductor beside the end surface, and as a result, the strength of bonding obtained using the conductive connection member (such as a solder) can be increased.

In the case in which the cross-sectional area of the second end portion of the columnar conductor is larger than that of the first end portion, when bonding (such as soldering) is performed using the conductive connection member, a bondable area of the columnar conductor to the conductive connection member is increased, and as a result, the bonding strength by the conductive connection member can be increased.

Since the multilayer electronic component according to the present invention has the columnar conductor which has the end surface exposed in the recess portion, when an electronic element is received in the recess portion to be electrically connected to the end surface of the columnar conductor, the structure can be obtained which is advantageous when the mounting density is improved.

According to the electronic device of the present invention, since the columnar conductor and the conductive connection portion at the mounting substrate side are formed so as to be directly bonded to each other with the conductive connection member, a pad electrode or the like does not need to be provided with the multilayer electronic component, and as a result, the manufacturing process of the multilayer electronic component can be more simplified.

When solder is used as the above conductive connection member, since being provided in the recess portion, the solder is unlikely to flow out of the recess portion, and as a result, solder flash can be made unlikely to be generated.

In the electronic device according to the present invention, when the conductive connection portion provided so as to protrude from the surface of the mounting substrate by a predetermined dimension in a height direction is fitted in the recess portion of the multilayer electronic component, the size and the height of the electronic device can be further reduced. In addition, since the dimension of the columnar conductor can be decreased in the axis line direction by a length corresponding to the dimension of the conductive connection portion in the height direction, strength against stress applied to the columnar conductor in a direction perpendicular to the axis line direction thereof, that is, resistance against a lateral pushing force, can be improved. Furthermore, when the conductive connection portion is fitted in the recess portion, alignment of the multilayer electronic component with respect to the mounting substrate can be performed.

According to the method for manufacturing a multilayer electronic component of the present invention, after manufacturing the composite substrate in the state in which the columnar conductor is buried in mounting, since the recess portion is formed in the resin layer so as to expose at least the end surface of the columnar conductor, the dimension in the axis line direction and the position of the end surface of the columnar conductor of the composite substrate are not required to have a very high accuracy. Hence, process control for manufacturing the multilayer electronic component can be simplified.

When the columnar conductor is formed from a sintered metal conductor, it is relatively difficult to obtain the dimension of the columnar conductor in the axis line direction with good repeatability due to, for example, influence of firing conditions and the like. Although there has been the problem as described above, according to the present invention, the end surface of the columnar conductor and the surface of the resin layer are not necessarily flush with each other, the columnar conductor may be simply formed so as to be buried in the resin layer, and the variation in dimension of the columnar conductor in the axis line direction may be adjusted by the depth of the recess portion.

In addition, according to the method for manufacturing a multilayer electronic component of the present invention, since a method for milling the entire surface of the resin layer is not used in order to expose the end surface of the columnar conductor, the resin layer can be formed to have a uniform thickness; hence, the accuracy of the dimension in the height direction of the obtained multilayer electronic component can be improved.

In the method for manufacturing a multilayer electronic component according to the present invention, when the process for forming the composite substrate is used, as described above, having a step of forming a not-yet sintered composite laminate which includes a not-yet sintered ceramic molded body and a non-sinterable inorganic material molded body in which the columnar conductor is buried; a step of firing the not-yet sintered composite laminate at a temperature at which the ceramic molded body is sintered and at which the inorganic material molded body is not sintered; and a step of removing the non-sinterable inorganic material molded body from the fired composite laminate, the ceramic substrate provided with the columnar conductor protruding from a major surface thereof can be easily obtained. Subsequently, when the resin layer is formed on the major surface of the ceramic substrate so as to bury the columnar conductor, the composite substrate can be efficiency obtained.

When the via conductor is formed in the ceramic molded body forming the above not-yet sintered composite laminate, and when the end portion of the columnar conductor is formed so as to be brought into contact with this via conductor, the structure can be easily obtained in which the columnar conductor is formed from the sintered metal conductor integrated with the via conductor formed in the ceramic substrate.

When transfer molding is used for forming the resin layer of the composite substrate, by using a mold having a flat surface which is brought into contact with the surface of the resin layer, the surface of the resin layer can be easily formed so as to have excellent flatness. In addition, as described above, when the columnar conductor is formed from a sintered metal conductor, it is relatively difficult to obtain the dimension of the columnar conductor in the axis line direction with superior repeatability due to, for example, the influence of firing conditions; however, according to the present invention, the resin layer may be simply formed so as to bury the columnar conductor therein, and hence molding using transfer molding can be applied to the formation of the resin layer without causing any problems.

In the method for manufacturing a multilayer electronic component, according to the present invention, in order to form the recess portion in the resin layer, when irradiation of laser light is performed, or when exposure and development of a photosensitive resin are performed, a desired recess portion having high accuracy in terms of dimension, shape, and position can be easily formed.

REFERENCE NUMERALS 1, 1a, 1b, 1c, 1d, 1e, 1f multilayer electronic component
2 electronic device
3 ceramic substrate
4, 7, 24 major surface
5 resin layer
8, 9, 41 recess portion
10, 11, 43, 44 columnar conductor
12, 13 first end portion
14, 15 second end portion
16, 17, 46, 47 end surface
18, 20, 22, 45 conductor film
19, 21 via conductor
23, 25, 42 electronic element
26 mounting substrate
27 conductor land
28 solder
31 composite laminate
32 ceramic molded body
33 inorganic material molded body

DETAILED DESCRIPTION OF THE INVENTION

Figure 1:
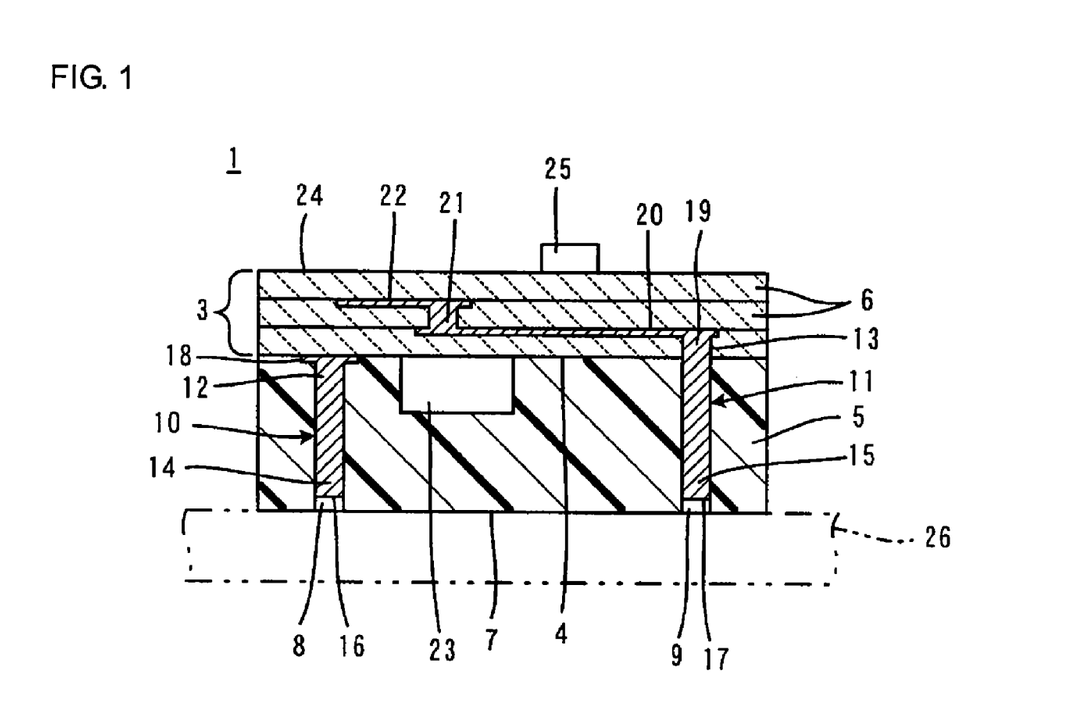
FIG. 1 is a cross-sectional view showing a multilayer electronic component 1 of a first embodiment according to the present invention.
Figure 2:
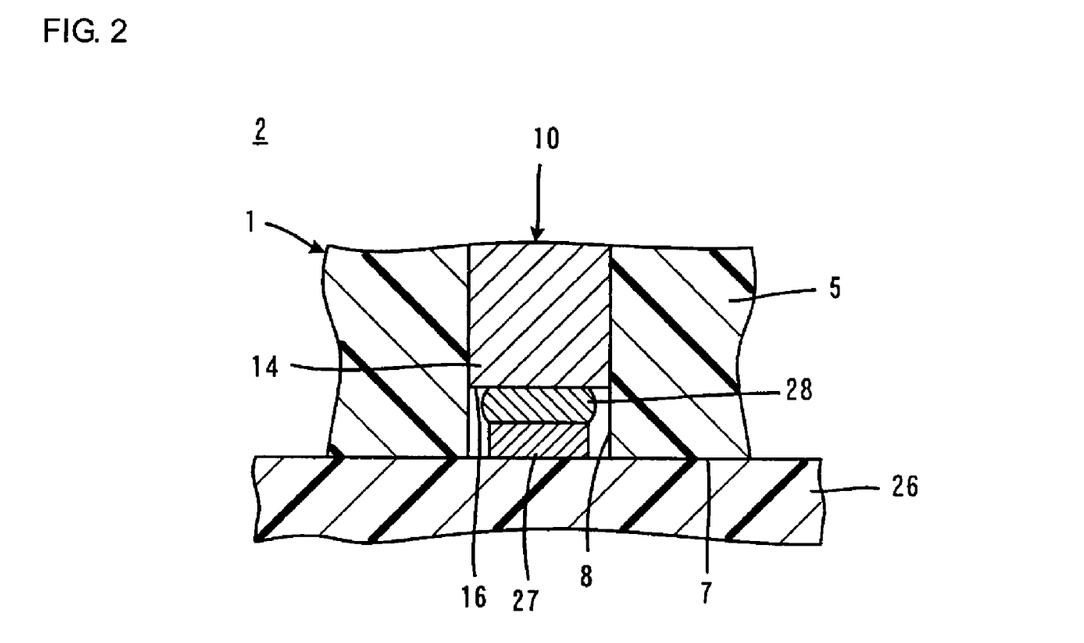
FIG. 2 is a partly enlarged cross-sectional view showing an electronic device 2 formed by mounting the multilayer electronic component 1 shown in FIG. 1 on a mounting substrate 26.
Figure 3:
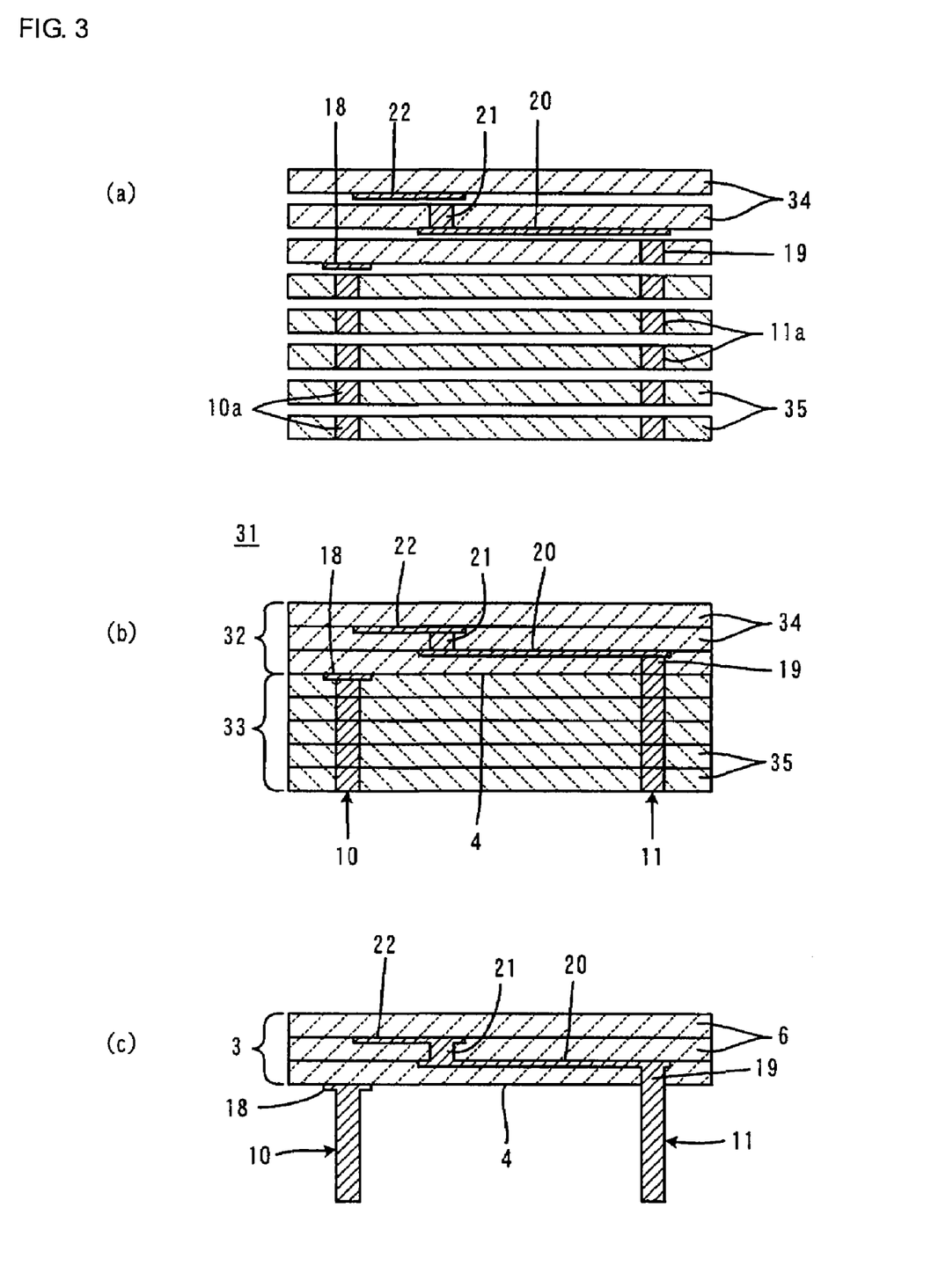
FIG. 3 includes views illustrating a method for manufacturing the multilayer electronic component 1 shown in FIG. 1, and in particular, for illustrating steps of manufacturing a composite substrate.

FIG. 1 to FIG. 3 are views illustrating a first embodiment according to the present invention. In this embodiment, FIG. 1 is a cross-sectional view of a multilayer electronic component 1, FIG. 2 is a partly enlarged cross-sectional view of an electronic device 2 obtained by mounting the multilayer electronic component 1 shown in FIG. 1 on a mounting substrate, and FIG. 3 includes cross-sectional views illustrating a method for manufacturing the multilayer electronic component 1.

As shown in FIG. 1, the multilayer electronic component 1 has a ceramic substrate 3 and a resin layer 5 formed on a major surface 4 of the ceramic substrate 3. The ceramic substrate 3 has a multilayer structure formed of ceramic layers 6 laminated to each other. The ceramic layer 6 is formed, for example, from a low-temperature firing ceramic material containing $Al_2O_3$ as filler and borosilicate glass as a sintering additive. In addition, the resin layer 5 is formed, for example, of an epoxy-based resin. The plan dimension of the ceramic substrate 3 is set, for example, to 105 mm by 105 mm.

At an outside-facing major surface 7 side of the resin layer 5, recess portions 8 and 9 are formed. In addition, in the resin layer 5, columnar conductors 10 and 11 are formed so that axis line directions thereof are aligned in the thickness direction of the resin layer 5. The columnar conductors 10 and 11 each have the following structure.

First end portions 12 and 13 of the columnar conductors 10 and 11, respectively, in the respective axis line directions each reach at least the interface between the ceramic substrate 3 and the resin layer 5, that is, the major surface 4 of the ceramic substrate 3. In addition, second end portions 14 and 15 of the columnar conductors 10 and 11, respectively, which are opposite to the respective first end portions 12 and 13, are located inside further from opening faces of the recess portions 8 and 9 and have end surfaces 16 and 17 exposed in the recess portions 8 and 9, respectively.

More particularly, the first end portion 12 of the columnar conductor 10 is located on the major surface 4 of the ceramic substrate 3 and is integrated with a conductor film 18 formed on this major surface 4. The first end portion 13 of the other columnar conductor 11 is located inside the ceramic substrate 3 and is integrated with a conductor film 20 formed along the interface between the ceramic layers 6 and with a via conductor 19 penetrating the ceramic layer 6 in the thickness direction. According to the structure as described above, the columnar conductor 11 may have a high mechanical strength, in particular, the resistance against a lateral pushing force, as compared to that of the columnar conductor 10. In this embodiment, the columnar conductors 10 and 11 having structures different from each other are formed; however, columnar conductors having only one of the above structures may also be formed.

In FIG. 1, as constituent elements formed inside the ceramic substrate 3, besides the via conductor 19 and the conductor film 20, a via conductor 21 and a conductor film 22 are also shown.

The above columnar conductors 10 and 11, the conductor films 18, 20 and 22, and the via conductors 19 and 21 are each made by a sinterable metal conductor made, for example, of Ag. In addition, whenever necessary, the end surfaces 16 and 17 of the columnar conductors 10 and 11, respectively, may be processed by Ni plating and Au plating.

The cross-section of the columnar conductors 10 and 11 each have, for example, a square shape having a size of 0.5 mm by 0.5 mm. The recess portions 8 and 9 each also have, for example, a square cross-sectional shape having a size of 0.5 mm by 0.5 mm. In addition, the cross-sectional shapes of the columnar conductors 10 and 11 and the recess portions 8 and 9 may be changed to a rectangle, a polygon other than a square, a circle, an oval, and the like.

In addition, as one example, the dimensions of the columnar conductors 10 and 11 in the axis line direction from the major surface 4 of the ceramic substrate 3 are each set to 0.7 mm, and in addition, the thickness of the resin layer 5 is set to 0.8 mm. Accordingly, the depths of the recess portions 8 and 9 are each set to 0.1 mm. The depths of the recess portions 8 and 9 are each preferably set in the range of 0.01 mm to 0.2 mm.

In addition, the multilayer electronic component 1 has an electronic element 23 mounted on the major surface 4 of the ceramic substrate 3 and embedded in the resin layer 5. The electronic element 23 is a semiconductor element such as an IC chip. An electronic element 25 is mounted on the other major surface 24 of the ceramic substrate 3. The electronic element 25 is a chip element such as a multilayer ceramic capacitor.

In FIG. 1, a mounting substrate 26 is shown by an imaginary line. When the electronic device 2 as shown in FIG. 2 is formed, the multilayer electronic component 1 is mounted on the mounting substrate 26. In this step, the multilayer electronic component 1 is placed so that the major surface 7 in which the above recess portions 8 and 9 are formed faces the mounting substrate 26 side.

In FIG. 2, the columnar conductor 10, which is one of the columnar conductors shown in FIG. 1, and the structure relating thereto are shown. The other columnar conductor 11 and the structure relating thereto are substantially the same as those of the columnar conductor 10 show in FIG. 2, and hence the figure and description of the columnar conductor 11 are omitted.

As shown in FIG. 2, a conductive land 27 used as a conductive connection portion is formed on the mounting substrate 26. The mounting substrate 26 is formed, for example, from a printed circuit board, and the conductive land 27 is formed, for example, from a Cu foil having a thickness of 100 μm. The columnar conductor 10 is electrically connected to the conductive land 27 via a solder 28 provided in the recess portion 8. In particular, in this embodiment, a constituent element such as a pad electrode is not provided at the multilayer electronic component 1 side, and the columnar conductor 10 and the conductive land 27 are directly connected to each other with the solder 28 provided therebetween.

As apparent from FIG. 2, since the solder 28 is provided inside the recess portion 8, the thickness of the solder 28 does not interfere with the reduction in size and height of the electronic device 2. In addition, even when the solder 28 is sufficiently provided in order to enhance the reliability in electrical connection between the columnar conductor 10 and the conductive land 27, it is possible to make the solder 28 unlikely to flow out of the recess portion 8, and hence the generation of solder flash can be suppressed. In addition, since the conductive land 27 is fitted in the recess portion 8, the thickness of the conductive land 27 does not interfere with the reduction in size and height of the electronic device 2. In addition, the alignment of the multilayer electronic component 1 with respect to the mounting substrate 26 is easily performed, and in addition, the resistance against a lateral pushing force can be increased. From the above point of view, the thickness of the conductive land 27 is preferably set to 5 μm or more. In addition, in this embodiment, although the conductive land 27 is fitted in the recess portion 8, the conductive connection portion is not limited to the conductive land 27, and for example, a wiring conductor, which is not fitted in the recess portion 8 and is exposed only on the surface of the mounting substrate 26, may also be used.

The multilayer electronic component 1 shown in FIG. 1 is manufactured as described below.

That is, in order to manufacture the multilayer electronic component 1, a composite-substrate-forming process for forming a composite substrate, which has the ceramic substrate 3 and the resin layer 5 burying the columnar conductors 10 and 11 therein, is first performed, and next, a recess-portion-forming process is performed in which the recess portions 8 and 9 are formed in the resin layer 5 at the outside-facing major surface 7 side so as to expose at least the end surfaces 16 and 17 of the second end portions 14 and 15 of the columnar conductors 10 and 11, respectively. The composite-substrate-forming process described above is preferably performed as follows.

FIG. 3 includes views illustrating the composite-substrate-forming process. In FIG. 3, the same reference numerals as in FIG. 1 designate constituent elements corresponding to those in FIG. 1, and a duplicate description is omitted.

In order to form the composite substrate, a not-yet sintered composite laminate 31 as shown in FIG. 3(b) is formed. The not-yet sintered composite laminate 31 has a not-yet sintered ceramic molded body 32 and a non-sinterable inorganic material molded body 33. The ceramic molded body 32 is to be formed into the ceramic substrate 3, and in this ceramic molded body 32, the above-described conductor films 18, 20, and 22 and the via conductors 19 and 21 are formed by a conductive paste in a green state. On predetermined positions of the major surface 4 of the ceramic molded body 32, conductive portions are formed by the conductor film 18 and the via conductor 19.

The non-sinterable inorganic material molded body 33 contains an inorganic material powder that is not sintered at a sintering temperature of the ceramic molded body 32. As described above, when the ceramic layer 6, by which the ceramic molded body 32 is to be formed, is formed using a ceramic material which contains $Al_2O_3$ as filler and borosilicate glass as a sintering additive, $Al_2O_3$ powder is advantageously used as the inorganic material powder contained in the inorganic material molded body 33. In the inorganic material molded body 33, the columnar conductors 10 and 11 are embedded in the state in which the axis line directions thereof are aligned in the thickness direction. At this stage, the columnar conductors 10 and 11 are formed from a conductive paste in a green state. The conductive paste for forming the columnar conductors 10 and 11 preferably has at least the same primary component as that of the conductive paste which forms the conductive portions which are obtained from the conductor film 18 and the via conductor 19. Furthermore, the same composition is preferably used. Accordingly, the bonding forces between the conductive portions and the respective columnar conductors 10 and 11 are increased, and hence the mechanical strengths of the columnar conductors 10 and 11 at the interface between the ceramic substrate 3 and the resin layer 5 can be further improved.

In addition, in the composite laminate 31, the not-yet sintered ceramic molded body 32 and the non-sinterable inorganic material molded body 33 are laminated to each other so that the conductor film 18 and the via conductor 19 functioning as the conductive portions are brought into contact with the end portions of the columnar conductors 10 and 11, respectively.

In order to form the above not-yet sintered composite laminate 31, a plurality of ceramic green sheets 34 to be formed into the ceramic molded body 32 and a plurality of inorganic material green sheets 35 to be formed into the inorganic material molded body 33 are prepared as shown in FIG. 3(a).

On specific ceramic green sheets 34, the conductive films 18, 20, and 22 are formed by printing using the conductive paste, as described above, and in addition, in specific ceramic green sheets 34, the via conductors 19 and 21 are formed, for example, by forming penetrating holes with irradiation of laser light, followed by filling the conductive paste in the penetrating holes.

In addition, in each of the inorganic material green sheets 35, via conductors 10a and 11a, which are to be formed into the columnar conductors 10 and 11, respectively, are formed by forming penetrating holes with irradiation of laser light, followed by filling the conductive paste into the penetrating holes.

In order to form the not-yet sintered composite laminate 31, shown in FIG. 3(b), the ceramic green sheets 34 and the inorganic material green sheets 35, which are shown in FIG. 3(a), may be laminated sheet by sheet starting from the sheet located at one side in the lamination direction, or after the ceramic green sheets 34 are laminated to form the ceramic molded body 32, and the inorganic material green sheets 35 are laminated to form the inorganic material molded body 33, the ceramic molded body 32 and the inorganic material molded body 33 may be laminated to each other.

Next, the not-yet sintered composite laminate 31 is fired at a temperature, such as 870° C., at which the ceramic molded body 32 is sintered but the inorganic material molded body 33 is not sintered. As a result, the ceramic molded body 32 is formed into the sintered ceramic substrate 3. On the other hand, the inorganic material molded body 33 still remains in a non-sintered state.

Next, the non-sinterable inorganic material molded body 33 is removed from the fired composite laminate 31. Even after the firing, the inorganic material molded body 33 is still in a non-sintered state, the removal thereof can be easily performed. By the removal of the inorganic material molded body 33, as shown in FIG. 3(c), the ceramic substrate 3 provided with the columnar conductors 10 and 11 protruding from the major surface 4 of the ceramic substrate 3 can be obtained.

Next, whenever necessary, after the electronic element 23 (see FIG. 1) is mounted on the major surface 4 of the ceramic substrate 3, the resin layer 5 is formed on the major surface 4 of the ceramic substrate 3 so as to bury the columnar conductors 10 and 11. Accordingly, a composite substrate in a state prior to the formation of the recess portions 8 and 9 of the multilayer electronic component 1 shown in FIG. 1 is formed.

For the formation of the resin layer 5 described above, molding is preferably performed by transfer molding. By the transfer molding, since the surface of the resin layer 5 is formed in conformity with the shape of a mold, the surface can be easily planarized. However, when the above advantage is not desired, a dispenser method may be used for forming the resin layer 5.

Next, a process for forming the recess portions 8 and 9 is performed for the composite substrate formed as described above. The recess-portion-forming process is performed using $CO_2$ laser and is carried out by irradiating the outside-facing major surface 7 of the resin layer 5 with laser light. Parts of the resin layer 5 covering the columnar conductors 10 and 11 are irradiated with laser light, and the irradiation areas are set to be approximately equivalent to the cross-sectional areas of the respective columnar conductors 10 and 11; however, whenever necessary, the irradiation area may be set to be larger or smaller than the cross-sectional area of each of the columnar conductors 10 and 11. The recess portions 8 and 9 may be formed using a drill or a punch which will not form a penetrating hole. The formation of the recess portions 8 and 9 lasts until at least the end surfaces 16 and 17 of the columnar conductors 10 and 11, respectively, are exposed. In addition, after the recess portions 8 and 9 are formed, carbon and the like adhere on the bottom and side surfaces of the recess portions 8 and 9, etching cleaning (desmear treatment), for example, is preferably performed.

The resin layer 5 may be formed using a photosensitive resin. In this case, in order to form the recess portions 8 and 9, a method is preferably used in which the photosensitive resin is exposed with a mask (not shown) having an opening at an area other than an area at which the recess portions 8 and 9 are to be formed, followed by performing development for forming the recess portions 8 and 9.

The resin layer 5 is formed so as to bury the columnar conductors 10 and 11. After that the recess portions 8 and 9 are formed in the resin layer 5 so as to expose the end surfaces 16 and 17 of the columnar conductors 10 and 11, respectively. Due to this, even though the dimensions of the columnar conductors 10 and 11 in the axis line direction vary at a manufacturing stage, the influence on the thickness of the resin layer 5 by the variation can be substantially avoided. In addition, by adjusting the depths of the recess portions 8 and 9, the dimensions of the axis line direction of the columnar conductors 10 and 11 can be adjusted. Accordingly, even when the columnar conductors 10 and 11 are formed from a sintered metal conductor, the dimension of which is liable to change, the problem of this variation in dimension can be advantageously avoided.

The columnar conductors 10 and 11 may be formed from a cured conductive resin instead of a sintered metal conductor. In this case, the columnar conductors 10 and 11 may be formed by disposing an uncured conductive resin filled, for example, in a resin sheet so as to be brought into contact with each of the conductive portions (the conductor film 18 and the via conductor 19) formed at predetermined portions of the major surface 4 of the ceramic substrate 3, followed by heat curing.

Next, whenever necessary, the electronic component 25 is mounted on the outside-facing major surface 24 of the ceramic substrate 3.

By the processes described above, the multilayer electronic component 1 shown in FIG. 1 is obtained.

FIGS. 4 to 7 are views illustrating second to fifth embodiments of the present invention and each showing a portion corresponding to that of the multilayer electronic component 1 shown in FIG. 2. In FIGS. 4 to 7, the same reference numerals as in FIG. 2 designate constituent elements corresponding to those shown in FIG. 2, and a duplicate description is omitted.

Figure 4:
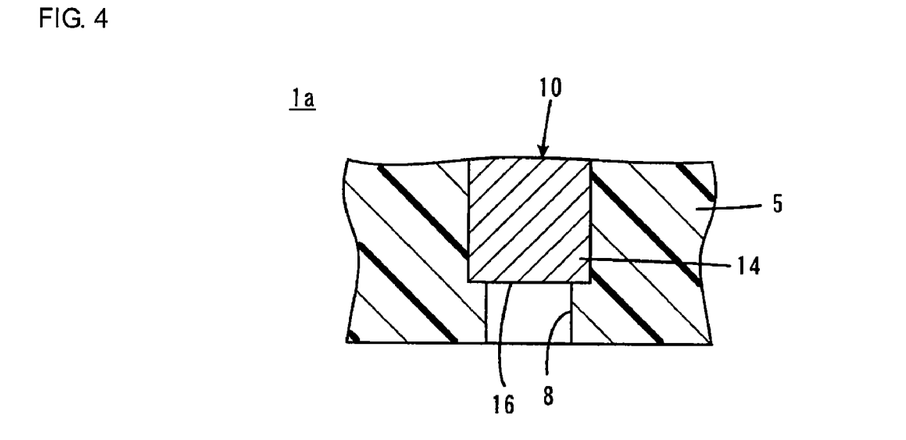
FIG. 4 is a partly enlarged cross-sectional view showing a multilayer electronic component 1a of a second embodiment according to the present invention.

In a multilayer electronic component 1a shown in FIG. 4, the end surface 16 of the columnar conductor 10 is partly exposed in the recess portion 8. According to this embodiment, compared to the cross-sectional area of the columnar conductor 10, that is, the area of the end surface 16, an area to which the solder 28 (see FIG. 2) is bondable can be decreased. Hence, while the cross-sectional area of the columnar conductor 10 is increased so as to increase the mechanical strength thereof, the degree of freedom of surface wiring and the like at the mounting substrate 26 (see FIG. 2) side can be increased.

Figure 5:
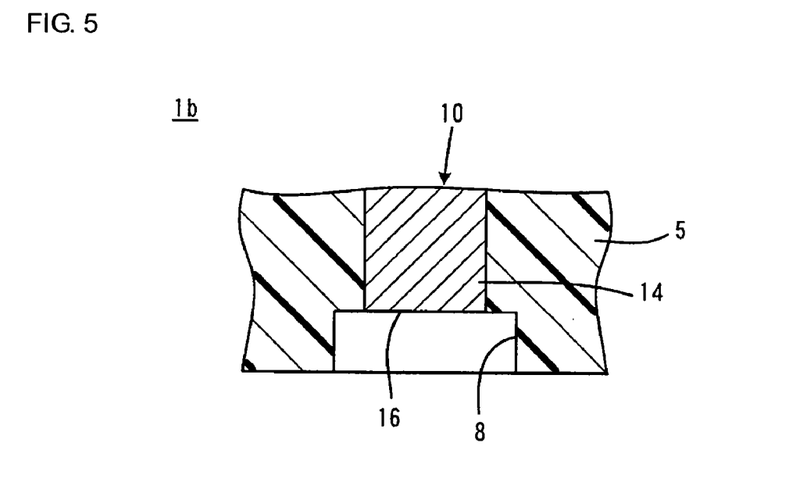
FIG. 5 is a partly enlarged cross-sectional view showing a multilayer electronic component 1b of a third embodiment according to the present invention.

In a multilayer electronic component 1b shown in FIG. 5, the recess portion 8 is formed so as to have a larger cross-sectional area than that of the columnar conductor 10. Hence, the end surface 16 of the columnar conductor 10 is exposed at a part of the bottom surface of the recess portion 8. Hence, at the part of the bottom surface of the recess portion 8, the end surface 16 of the columnar conductor 10 is exposed. According to this embodiment, since the solder 28 (see FIG. 2) can be applied to a wider area, the bonding strength by soldering can be enhanced.

Figure 6:
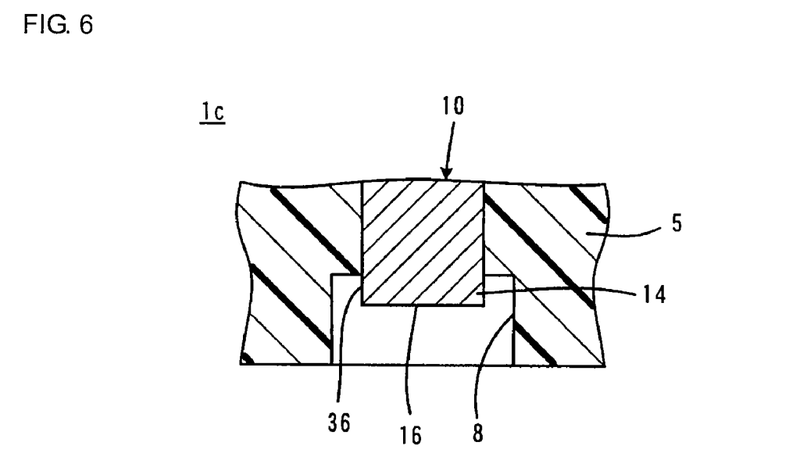
FIG. 6 is a partly enlarged cross-sectional view showing a multilayer electronic component 1c of a fourth embodiment according to the present invention.

In a multilayer electronic component 1c shown in FIG. 6, the second end portion 14 of the columnar conductor 10 protrudes from the bottom surface of the recess portion 8. According to this embodiment, since the solder 28 (see FIG. 2) adheres onto a side surface 36 of the columnar conductor 10 besides the end surface 16 thereof, the bonding strength by soldering can be increased, and hence the reliability of electrical connection can be further improved.

Figure 7:
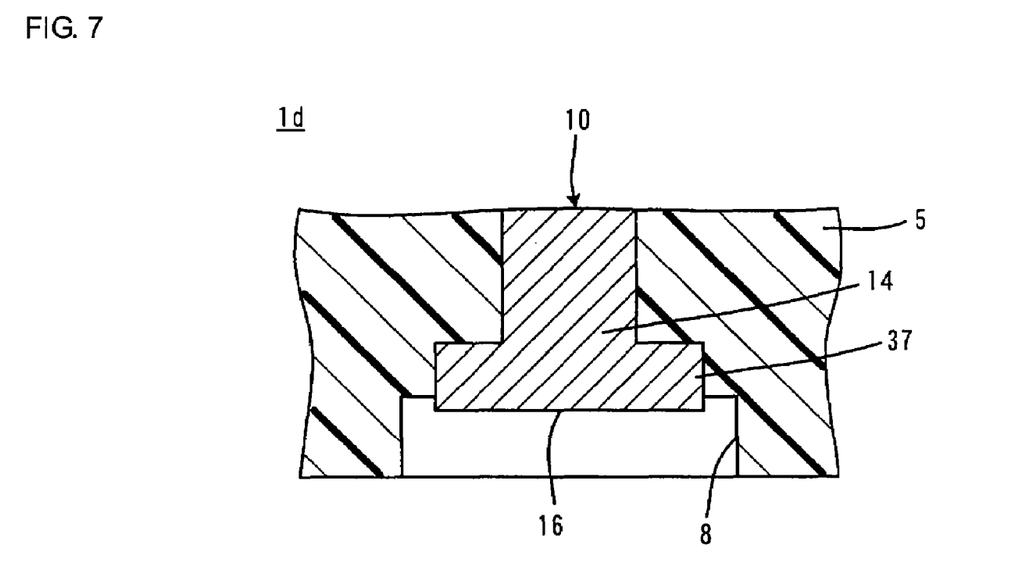
FIG. 7 is a partly enlarged cross-sectional view showing a multilayer electronic component 1d of a fifth embodiment according to the present invention.

In a multilayer electronic component 1d shown in FIG. 7, the cross-sectional area of the second end portion 14 of the columnar conductor 10 is set larger than that of the first end portion 12 (not shown in FIG. 7). According to this embodiment, the area of the end surface 16 can be increased, and thereby the area to which the solder 28 (see FIG. 2) adheres is increased; hence, as a result, the bonding strength by soldering can be increased, and in addition, the reliability of electrical connection can be further improved. In FIG. 7, although the second end portion 14 of the columnar conductor 10 protrudes from the bottom surface of the recess portion 8, the end surface 16 of the columnar conductor 10 may be formed at the same height as that of the bottom surface of the recess portion 8.

Figure 8:
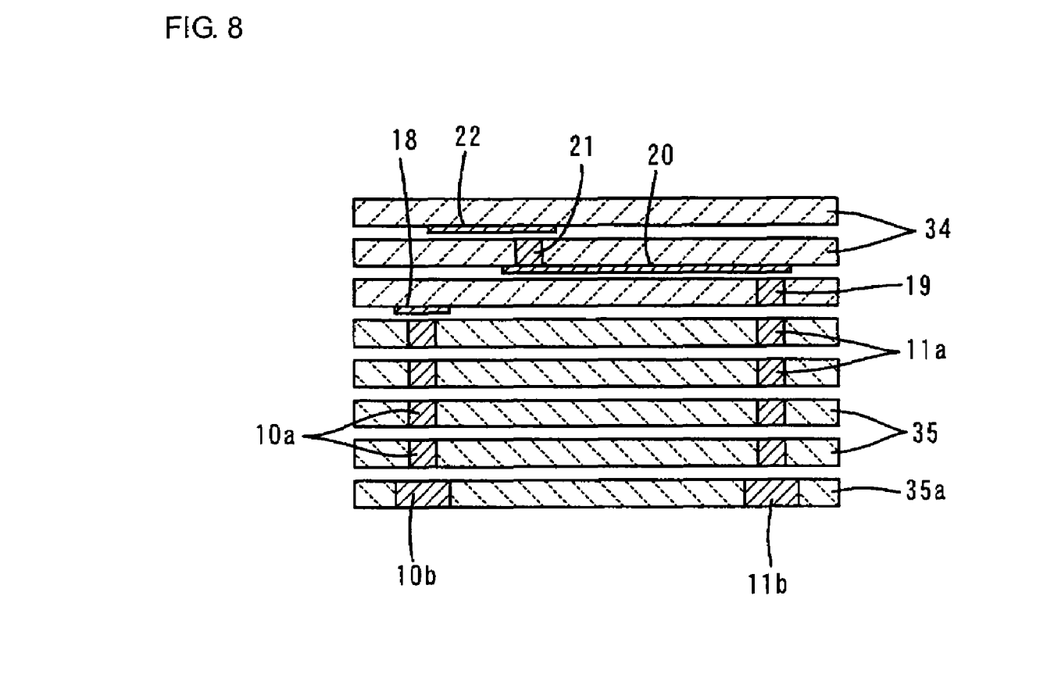
FIG. 8 is a view illustrating a method for manufacturing the multilayer electronic component 1d shown in FIG. 7, the view corresponding to FIG. 3(a).

In order to increase the cross-sectional area of the second end portion 14, the above columnar conductor 10 is formed to have a flange portion 37 at the second end portion 14. In order to obtain the columnar conductor 10 having the structure as described above, instead of the laminate structure shown in FIG. 3(a), a laminate structure shown in FIG. 8 is employed. In FIG. 8, the same reference numerals as in FIG. 3(a) designate the constituent elements corresponding to those shown in FIG. 3(a), and a duplicate description is omitted.

As shown in FIG. 8, in an inorganic material green sheet 35a disposed at an end portion in the laminate direction, via conductors 10b and 11b which are to be formed into the columnar conductors 10 and 11, respectively, are formed larger in dimension in the radial direction than the via conductors 10a and 11a formed in other inorganic green sheets 35. By the laminate structure as described above, the columnar conductor 10 having the flange portion 37 shown in FIG. 7 can be easily formed. In addition, whenever necessary, there may be formed at least two inorganic material green sheets 35a provided with the via conductors 10b and 11b having a larger dimension in the radius direction.

Figure 9:
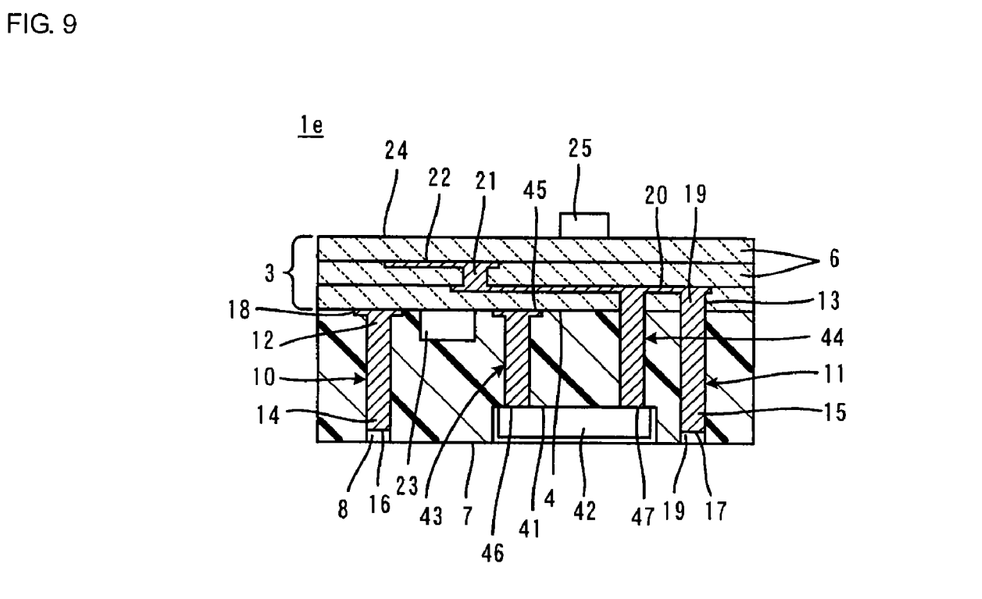
FIG. 9 is a cross-sectional view showing a multilayer electronic component 1e of a sixth embodiment according to the present invention.

FIG. 9 is a cross-sectional view showing a multilayer electronic component 1e of a sixth embodiment according to the present invention. In FIG. 9, the same reference numerals as in FIG. 1 designate constituent elements corresponding to those shown in FIG. 1, and a duplicate description is omitted.

In the multilayer electronic component 1e shown in FIG. 9, besides the recess portions 8 and 9, a recess portion 41 is further provided, and an electronic element 42 such as a chip element is received in the recess portion 41. The electronic element 42 is located inside the recess portion 41 further from an opening face thereof.

In addition, in the resin layer 5, besides the columnar conductors 10 and 11, columnar conductors 43 and 44 are disposed. The columnar conductor 43 reaches the interface between the ceramic substrate 3 and the resin layer 5 and is integrated with a conductor film 45 formed on the major surface 4 of the ceramic substrate 3. In addition, the columnar conductor 44 passes through the interface between the ceramic substrate 3 and the resin layer 5, extends inside of the ceramic substrate 3, and is then integrated with the conductor film 20.

In addition, the other end portions of the columnar conductors 43 and 44 have end surfaces 46 and 47, respectively, which are each located inside the recess portion 41 further from the opening face thereof and exposed in the recess portion 41. The electronic element 42 which is electrically connected to the end surfaces 46 and 47 of the columnar conductors 43 and 44, respectively, is received in the recess portion 41.

The multilayer electronic component 1e shown in FIG. 9 can be designed to advantageously form a high density mounting configuration.

Figure 10:
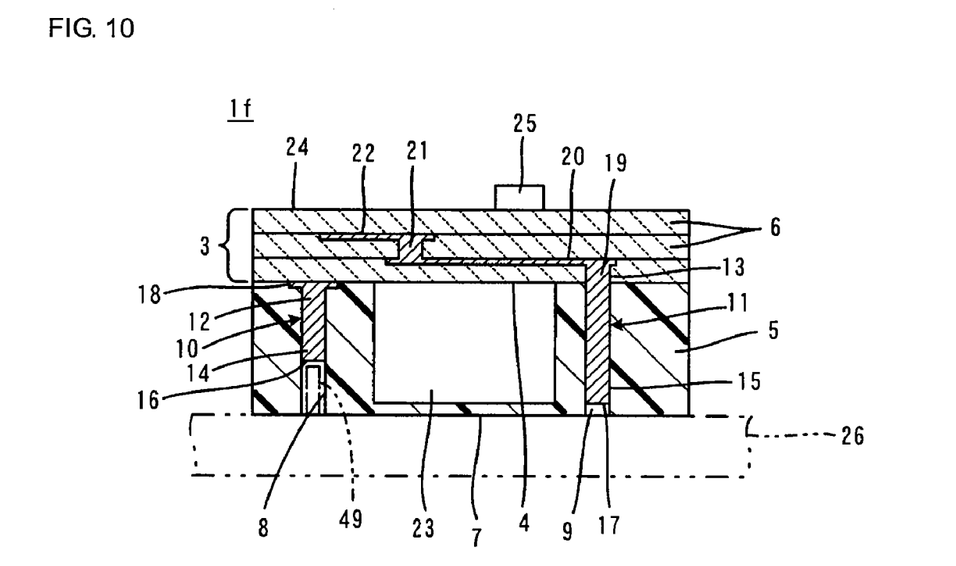
FIG. 10 is a cross-sectional view showing a multilayer electronic component 1f of a seventh embodiment according to the present invention.

FIG. 10 is a cross-sectional view showing a multilayer electronic component 1f of a seventh embodiment according to the present invention. In FIG. 10, the same reference numerals as in FIG. 1 designate constituent elements corresponding to those shown in FIG. 1, and a duplicate description is omitted.

In the multilayer electronic component 1f shown in FIG. 10, in particular, the dimension in the height direction of the electronic element 23 on the ceramic substrate 3 is larger than the dimension in the axis line direction of the columnar conductor 10 on the ceramic substrate 3. In addition, the dimensions of the columnar conductors 10 and 11 in the axis line direction are different from each other.

As is the case of the columnar conductor 10, when the dimension in the axis line direction is decreased, the mechanical strength can be increased for the ceramic substrate 3, and the resistance against a lateral pushing force can also be increased. In addition, when the resistance against a lateral pushing force is increased as described above, the cross-sectional dimension of the columnar conductor 10 can be decreased.

In FIG. 10, the mounting substrate 26 is shown by an imaginary line. On the mounting substrate 26, a pin-shaped connection portion 49 is provided as the conductive connection portion. This pin-shaped connection portion 49 is inserted into the recess portion 8 and is connected to the columnar conductor 10 by soldering, thereby forming the electrical connection.

The invention claimed is:

1. A multilayer electronic component comprising:
   a ceramic substrate;
   a resin layer formed on a major surface of the ceramic substrate, the resin layer including at least one recess portion at an outside-facing surface thereof; and
   at least one columnar conductor disposed in the resin layer so that an axis line direction of the at least one columnar conductor is aligned along a thickness direction of the resin layer, a first end portion of the columnar conductor in the axis line direction reaches at least an interface between the ceramic substrate and the resin layer, and a second end portion of the columnar conductor opposite to the first end portion is located inside the recess portion and has an end surface which is exposed in the recess portion.

2. The multilayer electronic component according to claim 1, wherein the second end portion of the columnar conductor is recessed from an opening face of the recess portion.

3. The multilayer electronic component according to claim 1, wherein the at least one columnar conductor is formed from a sintered metal conductor which is integrated with a via conductor formed in the ceramic substrate.

4. The multilayer electronic component according to claim 1, wherein the end surface of the at least one columnar conductor is partly exposed in the recess portion.

5. The multilayer electronic component according to claim 1, wherein the second end portion of the at least one columnar conductor protrudes from a bottom surface of the recess portion.

6. The multilayer electronic component according to claim 1, wherein the second end portion of the at least one columnar conductor has a cross-sectional area larger than a cross-sectional area of the first end portion.

7. The multilayer electronic component according to claim 1, further comprising a first electronic element mounted on the ceramic substrate and located in the resin layer.

8. The multilayer electronic component according to claim 7, wherein a height of the first electronic element on the ceramic substrate is greater than a height of the at least one columnar conductor in the axis line direction.

9. The multilayer electronic component according to claim 1, further comprising a second electronic element located inside the recess portion.

10. The multilayer electronic component according to claim 9, wherein the second electronic element recessed relative to an opening face of the recess portion.

11. An electronic device comprising:
   the multilayer electronic component according to claim 1;
   a mounting substrate on which the multilayer electronic component is mounted, wherein the multilayer electronic component is mounted so that the recess portion faces the mounting substrate; and a conductive connection portion on the mounting substrate, the columnar conductor electrically connected to the conductive connection portion via a conductive connection member provided inside the recess portion.

12. The electronic device according to claim 11, wherein the conductive connection member is a solder.

13. The electronic device according to claim 11, wherein the conductive connection portion protrudes from a surface of the mounting substrate by a predetermined height and is fitted inside the recess portion.

14. A method for manufacturing a multilayer electronic component, comprising:

forming a composite substrate that includes a ceramic substrate and a resin layer formed on a surface of the ceramic substrate, and at least one columnar conductor embedded in the resin layer so that an axis line direction of the columnar conductor is aligned in a thickness direction of the resin layer; and forming at least one recess portion in the resin layer at an outside-facing surface thereof so as to expose at least an end surface of a first end portion of the at least one columnar conductor, the first end portion being located at the outside-facing surface of the resin layer.

15. The method for manufacturing a multilayer electronic component, according to claim 14, wherein the composite substrate is formed by:

forming a not-yet sintered composite laminate, the not-yet sintered composite laminate including a not-yet sintered ceramic molded body and a non-sinterable inorganic material molded body which contains an inorganic material powder which is not sintered at a sintering temperature of the not-yet sintered ceramic molded body, the not-yet sintered ceramic molded body having a conductive portion formed on a surface thereof, and the columnar conductor being embedded in the non-sinterable inorganic material molded body so that the axis line direction thereof is aligned in a thickness direction of the non-sinterable inorganic material molded body, wherein the not-yet sintered ceramic molded body and the non-sinterable inorganic material molded body are laminated such that the conductive portion and a second end portion of the columnar conductor contact each other;

firing the not-yet sintered composite laminate at a temperature at which the ceramic molded body is sintered and at which the inorganic material molded body is not sintered such that the ceramic molded body is formed into the ceramic substrate;

removing the non-sinterable inorganic material molded body from the fired composite laminate; and forming the resin layer on the surface of the ceramic substrate so as to bury the columnar conductor.

16. The method for manufacturing a multilayer electronic component, according to claim 15, wherein the conductive portion formed on the surface of the not-yet sintered ceramic molded body is formed from a via conductor in the ceramic substrate.

17. The method for manufacturing a multilayer electronic component, according to claim 15, wherein the resin layer is formed by transfer molding.

18. The method for manufacturing a multilayer electronic component, according to claim 15, wherein an electronic element is mounted on the surface of the ceramic substrate before the resin layer is formed.

19. The method for manufacturing a multilayer electronic component, according to claim 14, wherein the at least one recess portion is formed by irradiating the outside-facing surface of the resin layer with laser light.

20. The method for manufacturing a multilayer electronic component, according to claim 14, wherein the resin layer is made of a photosensitive resin, and the at least one recess portion is formed by exposing the photosensitive resin with a mask having an opening at an area other than an area at which the recess portion is to be formed and performing development to form the at least one recess portion.

* * * * *